(12) United States Patent
Uemura

(10) Patent No.: US 10,608,605 B2
(45) Date of Patent: Mar. 31, 2020

(54) CIRCUIT, RECEIVING CIRCUIT, OPTICAL RECEIVER, OPTICAL TRANSMISSION SYSTEM, AND ACTIVE OPTICAL CABLE

(71) Applicant: KABUSHIKI KAISHA TOSHIBA, Tokyo (JP)

(72) Inventor: Hiroshi Uemura, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/115,234

(22) Filed: Aug. 28, 2018

(65) Prior Publication Data
US 2019/0214952 A1 Jul. 11, 2019

(30) Foreign Application Priority Data

Jan. 11, 2018 (JP) ................................ 2018-002453

(51) Int. Cl.
*H03F 3/45* (2006.01)
*H03F 3/08* (2006.01)
*H03K 5/24* (2006.01)
*H04B 10/69* (2013.01)

(52) U.S. Cl.
CPC ........... *H03F 3/45183* (2013.01); *H03F 3/08* (2013.01); *H03F 3/45475* (2013.01); *H03K 5/2481* (2013.01); *H04B 10/697* (2013.01); *H03F 2203/45631* (2013.01); *H03F 2203/45641* (2013.01); *H03F 2203/45702* (2013.01)

(58) Field of Classification Search
CPC . H03F 3/08; H03F 3/082; H03F 3/085; H03F 3/45

USPC .............. 330/301, 308, 259, 260; 240/214 A
See application file for complete search history.

(56) References Cited

U.S. PATENT DOCUMENTS

| 4,371,843 A * | 2/1983 | Fang ........................ H03F 1/086 330/253 |
|---|---|---|
| 5,550,511 A | 8/1996 | Miyashita |
| 7,605,660 B1 * | 10/2009 | Kobayashi .............. H03F 1/083 330/254 |
| 10,367,583 B2 * | 7/2019 | Ogata |

(Continued)

FOREIGN PATENT DOCUMENTS

| JP | H5-102837 A | 4/1993 |
| JP | H7-326936 A | 12/1995 |
| JP | H10-290130 A | 10/1998 |

(Continued)

*Primary Examiner* — Steven J Mottola
(74) *Attorney, Agent, or Firm* — Finnegan, Henderson, Farabow, Garrett & Dunner, L.L.P.

(57) ABSTRACT

According to an embodiment, a circuit includes a first transistor, a second transistor, and a third transistor. The first transistor includes a first control terminal to receive a first input signal, a first current terminal to output an inverted output signal, and a second current terminal. The second transistor includes a second control terminal to receive a second input signal, a third current terminal to output a non-inverted output signal, and a fourth current terminal connected to the second current terminal. The third transistor includes a third control terminal to receive the inverted output signal, a fifth current terminal electrically connected to the second and fourth current terminals, and a sixth current terminal electrically connected to a first power supply.

10 Claims, 9 Drawing Sheets

(56) References Cited

U.S. PATENT DOCUMENTS

2002/0175763 A1    11/2002   Dasgupta et al.

FOREIGN PATENT DOCUMENTS

| JP | 2001-251150 A | 9/2001 |
| JP | 2011-188228 A | 9/2011 |

* cited by examiner

CIRCUIT, RECEIVING CIRCUIT, OPTICAL RECEIVER, OPTICAL TRANSMISSION SYSTEM, AND ACTIVE OPTICAL CABLE

CROSS-REFERENCE TO RELATED APPLICATIONS

This application is based upon and claims the benefit of priority from. Japanese Patent Application No. 2018-2453, filed Jan. 11, 2018, the entire contents of which are incorporated herein by reference.

FIELD

Embodiments of the present invention relate to a circuit that outputs differential signals.

BACKGROUND

As the information society has developed and electronic devices have improved in performance, the improvements in signal transmission rate becomes more important in information communication devices. Optical transmission is a key technology for realizing such improvements in signal transmission rate.

Generally, an optical signal is transmitted as a single-ended optical signal. This single-ended optical signal is converted into a single-ended electrical signal on a receiver side, and is further converted into a differential signal by a single-ended input to differential output converting circuit. The latter conversion may cause asymmetry in differential signal, which hinders the improvement of signal transmission rate.

DETAILED DESCRIPTION

Figure 1:
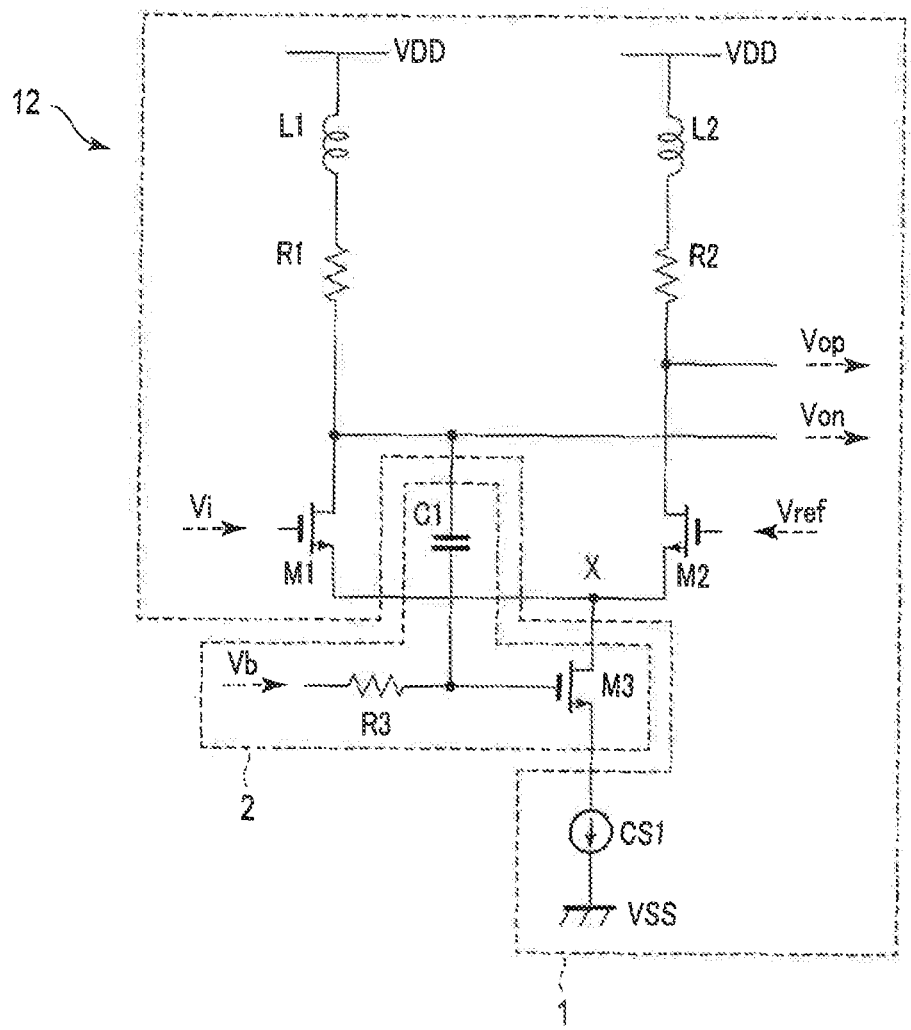
FIG. 1 is a circuit diagram illustrating an example of a single-ended input to differential output converting circuit according to an embodiment.

According to an embodiment, a circuit includes a first transistor, a second transistor, and a third transistor. The first transistor includes a first control terminal to receive a first input signal, a first current terminal to output an inverted output signal, and a second current terminal. The second transistor includes a second control terminal to receive a second input signal, a third current terminal to output a non-inverted output signal, and a fourth current terminal connected to the second current terminal. The third transistor includes a third control terminal to receive the inverted output signal, a fifth current terminal electrically connected to the second current terminal and the fourth current terminal, and a sixth current terminal electrically connected to a first power supply.

Hereinafter, embodiments will be described with reference to the drawings. In the description below, structural elements that are identical or similar to those already described will be denoted by the same or similar reference symbols, and repetitive descriptions will be basically omitted. For example, in cases where a plurality of identical or similar structural elements exist, a common reference may be given to explain without distinction between these elements. Alternatively, branch numbers may be given in addition to the common reference to explain with distinction between these elements.

Embodiment

First, a single-ended signal and a differential signal will be briefly explained.

A single-ended signal transmits a single data piece over a single signal wire. In this respect, neither ground nor shield is counted as a signal wire. Whether a single-ended signal is high level or low level is determined depending on whether the single-ended signal is higher or lower than a reference voltage.

A differential signal transmits a single data piece over two signal wires. In this respect also, neither ground nor shield is counted as a signal wire. A differential signal includes both a non-inverted signal and an inverted signal. The latter is different in phase by 180 degrees from the former. Whether a differential signal is high level or low level is determined depending on a sign of differential between the non-inverted signal and the inverted signal.

As compared to a single-ended signal, a differential signal has higher resistance to noise such as common mode noise, EMI (Electro Magnetic Interference) noise, etc., and is therefore suitable for high-rate signal transmission over a long distance. On the other hand, a differential signal requires twice as many signal wires as a single-ended signal, thereby increasing a material cost for signal wires.

According to this embodiment, a single-ended input to differential output converting circuit is used, for example, as an optical receiver in an optical transmission system, for example. An optical signal allows for higher-rate signal transmission as compared to an electrical signal, and is therefore suitable for data transmission. Generally, an optical signal is transmitted as a single-ended signal from the perspective of reduction in material cost for optical transmission line. An optical receiver photoelectrically converts an optical signal received from an optical transmission line into a single-ended electrical signal, and further converts this signal into a differential electrical signal, thereby outputting this signal, for the purpose of improving noise resistance. For this conversion from a single-ended signal to a differential signal (hereinafter referred to as single-ended to differential conversion), the single-ended input to differential output converting circuit according to this embodiment is usable.

In addition to the optical transmission system, the single-ended input to differential output converting circuit according to this embodiment is also usable for a receiver of a wireless communications system. An RF (Radio Frequency) signal is propagated as a single-ended signal through a space. However, a receiver generally handles a received signal by converting it into a differential signal. Thus, a received single-ended signal needs to be converted into a differential signal.

As illustrated in FIG. 1, a single-ended input to differential output converting circuit 12 according to this embodiment includes a differential amplifier 1 and an auxiliary circuit 2.

If a differential input signal is given, the differential amplifier 1 can generate a differential output signal by amplifying a voltage level of the differential input signal. In the following description, however, the differential amplifier 1 is given single-ended input signal Vi and reference voltage signal Vref instead of a differential input signal, and generates non-inverted output signal Vop and inverted output signal Von. That is, the differential amplifier 1 converts the single-ended signal (i.e., the single-ended input signal Vi) into the differential signal (i.e., the non-inverted output signal Vop and the inverted output signal Von). The single-ended input signal Vi is, for example, an NRZ (Non Return to Zero) signal of 25 [Gb/s], but is not limited thereto.

Herein, the non-inverted output signal Vop is a signal having the same phase as that of the single-ended input signal Vi. The inverted output signal Von is a signal having the reverse phase to that of the single-ended input signal Vi. That is, when the single-ended input signal Vi is high-level, the non-inverted output signal Vop and the inverted output signal Von are high-level and low-level respectively, and a differential output signal is high-level. On the other hand, when the single-ended input signal Vi is low-level, the non-inverted output signal Vop and the inverted output signal Von are low-level and high-level respectively, and a differential output signal is low-level. However, in reality, since a phase delay may exist between the single-ended input signal Vi and the signals of the non-inverted output signal Vop and the inverted output signal Von, strictly speaking, the timing of level changes is not always synchronized.

It is preferable that the reference voltage signal Vref be a DC or low-frequency voltage signal substantially equal to an average voltage of the single-ended input signal Vi. For example, such a reference voltage signal Vref can be obtained as an output by passing the single-ended input signal Vi through a low-pass filter. It is preferable that a voltage level of the reference voltage signal Vref be constant (except for fluctuations due to noise or drift).

Specifically, the differential amplifier a includes a transistor M1, a transistor M2, a current source CS1 (corresponding to a so-called tail current source), an inductor L1, a resistor R1, an inductor L2, and a resistor R2. The transistor M1 receives the single-ended input signal Vi and outputs the inverted output signal Von. The transistor M2 receives the reference voltage signal Vref and outputs the non-inverted output signal Vop. The current source CS1 is connected to a common node of the transistors M1 and M2. The inductor L1 and the resistor R1 are loads at the inverted output signal Von side. The inductor L2 and the resistor R2 are loads at the non-inverted output signal Vop side.

The transistor M1 is, for example, an N channel FET (Field Effect Transistor) and includes a control terminal (gate terminal) and two current terminals (a drain terminal and a source terminal). The transistor M1 may adopt, but is not limited to, MOSFET in a CMOS (Complementary Metal-Oxide-Semiconductor) process of 65-nm node.

In the transistor M1, the gate terminal receives the single-ended input signal Vi. The amount of current flowing through a channel (current path) between the drain terminal and the source terminal of the transistor M1 depends on a gate potential of the transistor M1. The gate terminal of the transistor M1 corresponds to a non-inverted input terminal of the differential amplifier 1.

The drain terminal of the transistor M1 outputs the inverted output signal Von. The drain terminal of the transistor M1 corresponds to an inverted output terminal of the differential amplifier 1. Furthermore, the drain terminal of the transistor M1 is connected to a power supply VDD via the inductor L1 and the resistor R1. Herein, a voltage of the power supply VDD is, for example, 1.2 [V], but is not limited thereto.

The source terminal of the transistor M1 is connected to a power supply VSS via the current source CS1 and a transistor M3 included in the auxiliary circuit 2 to be described later. Herein, a voltage of the power supply VSS is, for example, 0 [V] (that is, the power supply VSS corresponds to ground), but is not limited thereto.

Furthermore, the source terminal of the transistor M1 is connected to the source terminal of the transistor M2. That is, the transistors M1 and M2 are paired as transistors sharing a common source. The common source shared by the transistors M1 and M2 is also called a node X.

As is the case for the transistor M1, the transistor M2 is, for example, an N channel FET and includes a control terminal (gate terminal) and two current terminals (a drain terminal and a source terminal).

In the transistor M2, the gate terminal receives the reference voltage signal. The amount of current flowing through a channel between the drain terminal and the source terminal of the transistor M2 depends on a gate potential of the transistor M2. The gate terminal of the transistor M2 corresponds to an inverted input terminal of the differential amplifier 1.

The drain terminal of the transistor M2 outputs the non-inverted output signal Vop. The drain terminal of the transistor M2 corresponds to a non-inverted output terminal of the differential amplifier 1. Furthermore, the drain terminal of the transistor M2 is connected to the power supply VDD via the inductor L2 and the resistor R2.

The source terminal of the transistor M2 is connected to the power supply VSS via the current source CS1 and the transistor M3. Furthermore, the source terminal of the transistor M2 is connected to the source terminal, that is, the node X, of the transistor M1.

The current source CS1 includes a first current terminal and a second current terminal. The first current terminal of the current source CS1 is connected to the node X via the transistor M3. The second current terminal, of the current source CS1 is connected to the power supply VSS. The current source CS1 is a constant current source that causes the constant amount of current to flow between the first current terminal and the second current terminal. For example, a current flowing through the current source CS1 is 5 [mA], but is not limited thereto.

The current source CS1 may be, for example, a transistor (e.g., an N channel FET), in which a constant voltage is applied to a control terminal (e.g., a gate terminal) of this transistor. The current source CS1 is not limited to a single transistor, and may include a plurality of transistors. In the differential amplifier 1, the current source CS1 is replaceable with a resistive element such as a resistor.

The inductor L1 includes a first terminal and a second terminal. The first terminal of the inductor L1 is connected to the power supply VDD. The second terminal of the inductor L1 is connected to the first terminal of the resistor R1. The inductor L1 may be an on-chip inductor formed by, for example, wiring Cu (copper) in a spiral shape. A value of the inductor L1 may be taken as, but is not limited to, 1.0 [nH], for example.

The inductor L2 includes a first terminal and a second terminal. The first terminal of the inductor L2 is connected to the power supply VDD. The second terminal of the inductor L2 is connected to the first terminal of the resistor R2. The inductor L2 may be an on-chip inductor formed by, for example, wiring Cu (copper) in a spiral shape. A value of the inductor L2 may be taken as, but is not limited to, 1.0 [nH], for example.

The inductor L1 and the inductor L2 may be the same or different in inductance. As described later, a differential output signal can be further improved in its symmetry by adjusting the inductors L1 and L2 in a manner so that they take different values.

The resistor R1 includes a first terminal and a second terminal. The first terminal of the resistor R1 is connected to the second terminal of the inductor L1. The second terminal of the resistor R1 is connected to the drain terminal of the transistor M1. The resistor R1 may be formed of, for example, poli-Si (silicon). A value of the resistor R1 may be taken as, but is not limited to, 120 [Ω].

The resistor R2 includes a first terminal and a second terminal. The first terminal of the resistor R2 is connected to the second terminal of the inductor L2. The second terminal of the resistor R2 is connected to the drain terminal of the transistor M2. The resistor R2 may be formed of, for example, poli-Si (silicon). For example, a value of the resistor R2 may be taken as, but is not limited to, 120 [Ω].

The resistor R1 and the resistor R2 may be either the same or different in resistance value. If the inductors L1 and L2 are adjusted to take different values, the resistors R1 and R2 may also be adjusted to take different values, as described later, in order to secure the symmetry of the differential amplifier 1.

A parasitic resistance of the inductor L1 and/or the inductor L2 may substitute for the resistor R1 and/or the resistor R2. Alternatively, the inductor L1 and/or the inductor L2 may be removed from the differential amplifier 1. In terms of layout, it is possible to swap the inductor L1 and the resistor R1 and also to swap the inductor L2 and the resistor R2.

The auxiliary circuit 2 improves the symmetry of differential output signal, as described later. The auxiliary circuit 2 includes the transistor M3, a capacitor C1, and a resistor R3.

As is the case for the transistors M1 and M2, the transistor M3 is, for example, an N channel FET and includes a control terminal (gate terminal) and two current terminals (a drain terminal and a source terminal).

The transistor M3 has a gate terminal connected to the second terminal of the capacitor C1 and the second terminal of the resistor R3. The aforementioned capacitor C1 and resistor R3 function as a high-pass filter. In the transistor M3, therefore, the gate terminal receives a high-frequency component of the inverted output signal Von. The amount of current flowing through a channel between the drain terminal and the source terminal of the transistor M3 depends on a gate potential of the transistor M3. The inverted output signal Von may be directly applied to the gate terminal of the transistor M3 without using a high-pass filter. Such a case may also benefit from the advantageous effects of the embodiment. However, the following description will be made based on the case of using a high-pass filter.

The drain terminal of the transistor M3 is connected to the common source of the transistors M1 and M2, that is, the node X. On the other hand, the source terminal of the transistor M3 is connected to the power supply VSS via the current source CS1.

The transistor M3 and the current source CS1 can be swapped in layout. That is, the drain terminal and the source terminal of the transistor M3 may be either directly or indirectly connected (electrically connected) to the node X and the power supply VSS, respectively. However, a layout involving such swapping increases the adverse effects of drain capacity of the transistor as the current source CS1. Thus, the layout shown in FIG. 1 is superior in terms of symmetry of a differential output signal.

The capacitor C1 includes a first terminal and a second terminal. The first terminal of the capacitor C1 is connected to the drain terminal of the transistor M1. That is, the first terminal of the capacitor C1 receives the inverted output signal Von. The capacitor C1 has a second terminal connected to the gate terminal of the transistor M3 and the second terminal of the resistor R3. The capacitor C1 may be a MOM (Metal Oxide Metal) capacitor formed by stacking a comb-shaped electrode using an oxide film as dielectric, for example. A value of the capacitor C1 may be taken as, but is not limited to, 25 [fF].

The resistor R3 includes a first terminal and a second terminal. The first terminal of the resistor R3 receives a bias voltage signal Vb. The second terminal of the resistor R3 is connected to the gate terminal of the transistor M3 and the second terminal of the capacitor C1. The resistor R3 may be formed of, for example, poli-Si (silicon). A value of the resistor R3 may be taken as, but is not limited to, 20 [kΩ].

The capacitor C1 and the resistor R3 correspond to a high-pass filter. This high-pass filter extracts a high-frequency component from the inverted output signal Von, thereby supplying this component to the gate terminal, of the transistor M3. Accordingly, in the inverted output signal Von which is applied to the gate terminal of the transistor M3, the amplitude of its high-frequency component can be adjusted based on a value of the capacitor C1. Furthermore, a suitable bias voltage signal Vb can be applied to the gate terminal of the transistor M3 via the resistor R3, as described later. As described above, by using the high-pass filter, a signal which is applied to the gate terminal of the transistor M3 can be easily controlled. This produces an advantageous effect of improved degree of freedom in circuit design. The capacitor C1 and the resistor R3 are a mere example of the high-pass filter. For example, the resistor R3 may be replaced with an inductor (not shown). Not only a high-pass filter but also various types of circuits or their combinations may be used to extract a high-frequency component from the inverted output signal Von.

It is preferable that a voltage level of the bias voltage signal Vb be constant (except for fluctuations due to noise or drift). In addition, it is preferable that a voltage level of the bias voltage signal Vb fall within a range described below.

Specifically, if a voltage level of the bias voltage signal Vb is too high, the transistor M3 experiences a shortage of voltage between its drain and source (hereinafter, referred to as drain-source voltage), and thereby operates within a linear region. This makes it difficult to control a current flowing through the channel between the drain terminal and the source terminal of the transistor M3. Therefore, an upper limit for a voltage level of the bias voltage signal Vb is set to a value in a manner to secure a drain-source voltage necessary for the transistor M3 to operate within a saturated region. In contrast, if a voltage level of the bias voltage signal Vb is too low, the transistor M3 decreases in source potential, causing a shortage of transistor drain-source voltage as the current source CS1, for example. As a result, the current source CS1 is no longer operable as a constant current source. Therefore, a lower limit for a voltage level of the bias voltage signal Vb is set to a value in a manner so that the current source CS1 is operable as a constant current source. As described above, it is preferable that a voltage level of the bias voltage signal Vb fall into a range in which the transistor M3 is operable within a saturated region and the current source CS1 is operable as a constant current source.

Next, operation of the single-ended input to differential output converting circuit 12 will be described.

When the single-ended input signal Vi is inputted to the gate terminal of the transistor M1, a drain current of the transistor M1 (a current flowing from the drain terminal to the source terminal of the transistor M1) is modulated depending on a voltage level of the single-ended input signal Vi. Hereinafter, a drain current of the transistor M1 is sometimes referred to as a "modulation current". The inductor L1 and the resistor R1, serving as loads connected to the drain terminal of the transistor M1, modulate a drain potential of the transistor M1, resulting in the generation of the inverted output signal Von.

On the other hand, this modulation current flows into the transistor M2 via the common source of the transistors M1 and M2, that is, the node X. Since the reference voltage signal Vref, which is approximately constant, is applied to the gate terminal of the transistor M2, a drain potential of the transistor M2 is modulated by the modulation current, thereby resulting in the generation of the non-inverted output signal Vop.

As a comparative example regarding the differential output signal symmetry, a circuit obtained by removing the auxiliary circuit 2 from the single-ended input to differential output converting circuit 12, (that is, the differential amplifier 1) will be discussed. In the comparative example, when a modulation current flows through the common source (node X) of the transistors M1 and M2, a high-frequency component of this modulation current is attenuated by a parasitic capacity of the node X (for example, a drain capacity of the transistor as the current source CS1). That is, a high-frequency component of the modulation current flows to a parasitic capacity of the node X, thereby not reaching the transistor M2. Therefore, the modulation current, which is outputted from the transistor M1 and has a high-frequency component attenuated, is supplied to the transistor M2. As a result, the non-inverted output signal Vop becomes equivalent to a signal obtained by attenuating a high-frequency component of a phase inverted signal of the inverted output signal Von. To be more specific, the symmetry of differential output signal is broken. Such an adverse effect produced by a parasitic capacity of the node X becomes more serious as a signal transmission rate rises.

Figure 2:
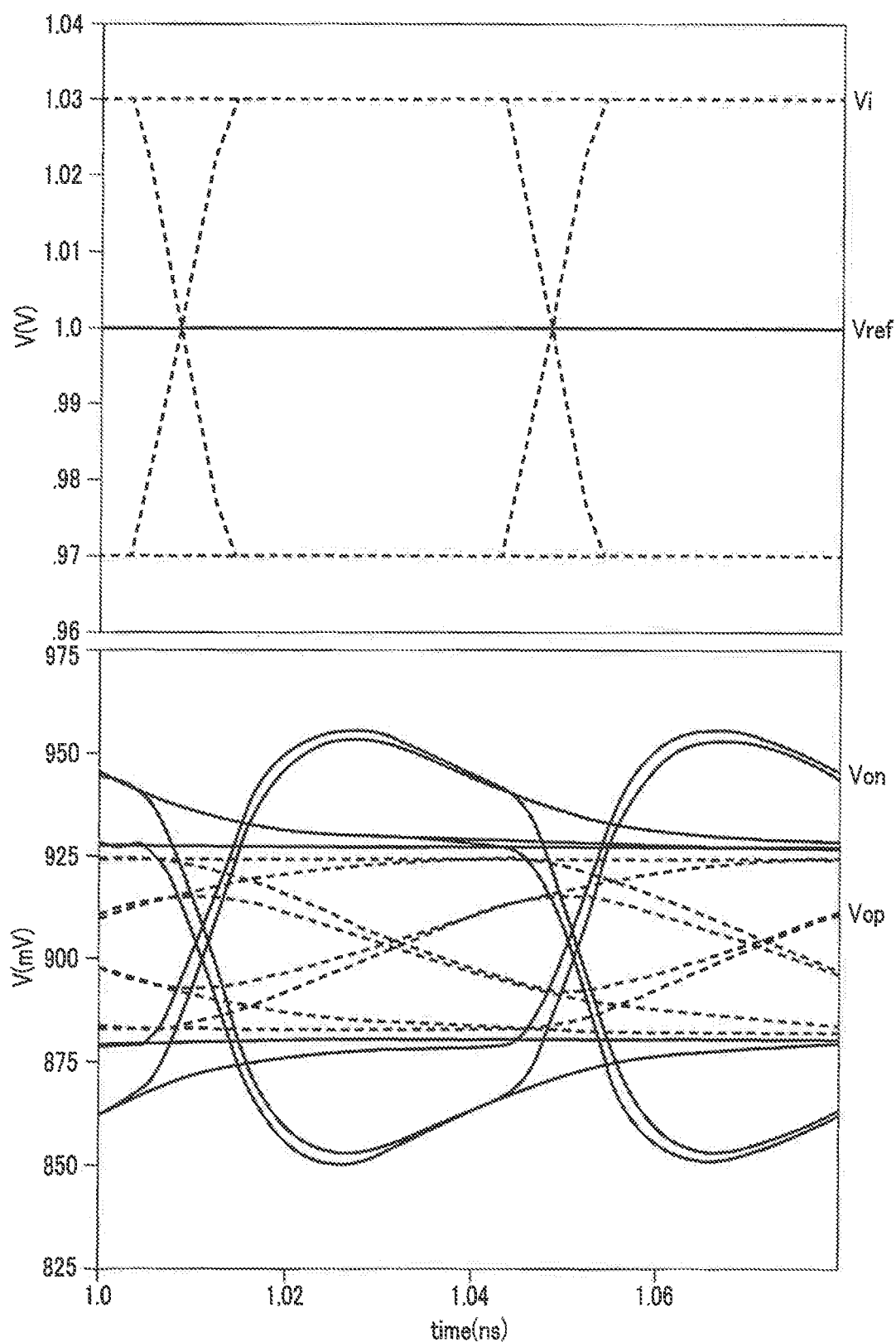
FIG. 2 is a graph illustrating eye patterns of a single-ended input to differential output converting circuit according to a comparative example.

FIG. 2 illustrates the single-ended input signal Vi, the reference voltage signal Vref, the non-inverted output signal Vop, and the inverted output signal Von in the single-ended input to differential output converting circuit according to the comparative example. FIG. 2 is a view in which the results of transient-response analysis of those signals are displayed in an eye pattern (the transient-response waveforms are displayed by being overlapped at a constant frequency).

According to the example shown in FIG. 2, the single-ended input signal Vi is a random signal modulated in a manner to have an average voltage of 1.0 [V], an amplitude of 60 [mV], and a bit rate of 25 [Gb/s]. The reference voltage signal Vref is a direct voltage signal of 1.0 [V].

According to FIG. 2, the non-inverted output signal Vop corresponds to a signal obtained by attenuating a high-frequency component of a phase inverted signal of the inverted output signal Von. Thus, it is understood that the differential output signal symmetry is broken.

A differential amplifier connected to a stage after the single-ended input to differential output converting circuit may perform nonlinear operation due to e.g., a voltage limit. Therefore, if the symmetry of differential signal is broken, one of signals (for example, the inverted output signal) constituting the differential output signal has a large distortion in its waveform, thereby causing irreversible deterioration in a signal quality, leading to the risk of rendering a signal unable to be transmitted. As described above, the differential output signal asymmetry of the single-ended input to differential output converting circuit may be one of the factors that limit available transmission rate.

Figure 3:
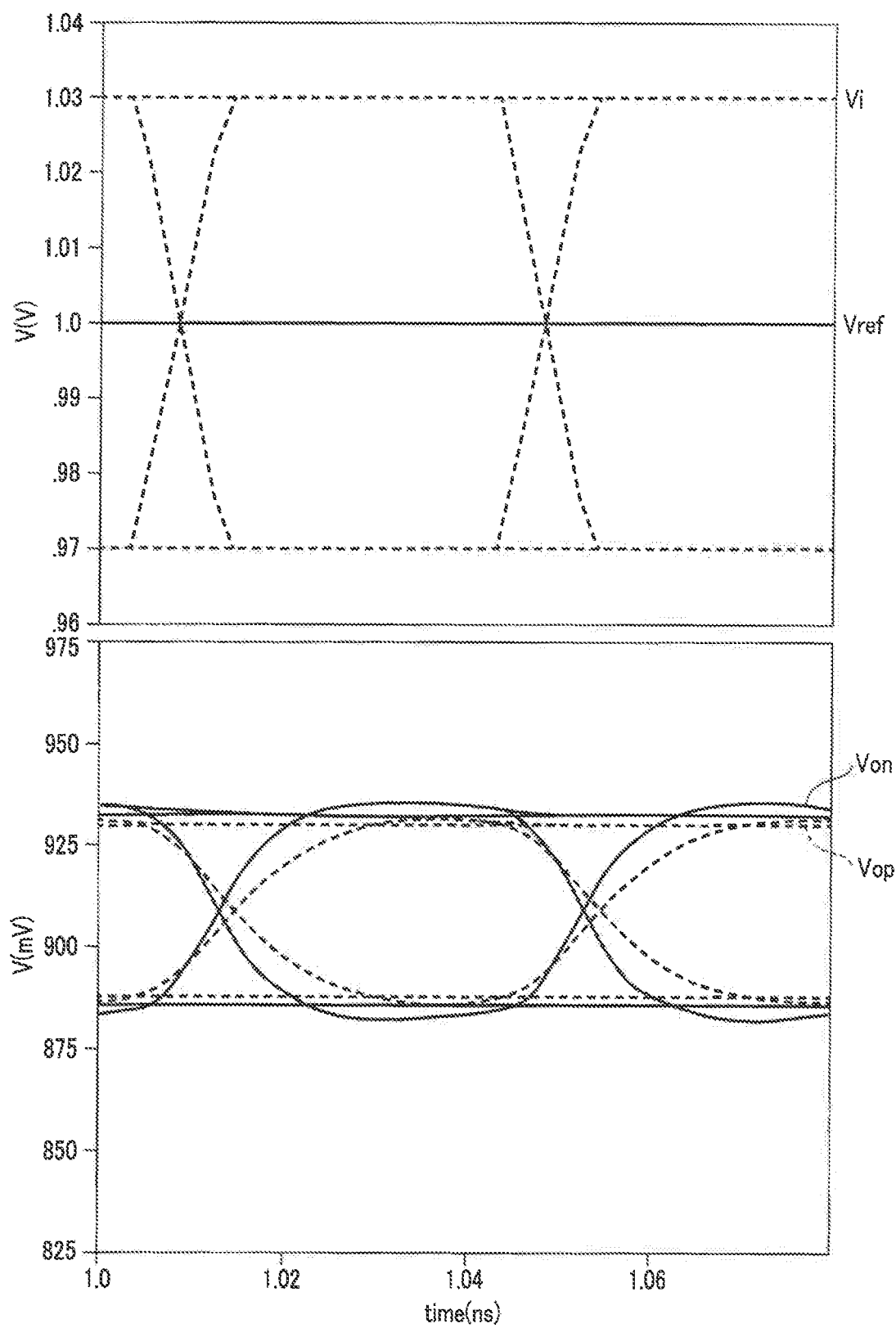
FIG. 3 is a graph illustrating eye patterns of the single-ended input to differential output converting circuit in FIG. 1.

Next, FIG. 3 illustrates the single-ended input signal Vi, the reference voltage signal Vref, the non-inverted output signal Vop, and the inverted output signal Von in the single-ended input to differential output converting circuit 12. FIG. 3 is a view in which the results of transient-response analysis of those signals are displayed in an eye pattern, as in FIG. 2. The simulation in FIG. 3 was conducted under the same condition as that of the simulation in FIG. 2, except for the addition of the auxiliary circuit 2. Therefore, the eye patterns of single-ended input signal Vi and reference voltage signal Vref are the same as those in FIG. 2.

It is clear that the differential output signal in FIG. 3 is greatly improved in symmetry as compared to that of FIG. 2. This indicates that the auxiliary circuit 2 improves the symmetry of differential output signal. Hereinafter, operation of the auxiliary circuit 2 will be described.

First, when the single-ended input signal Vi is inputted to the gate terminal of the transistor M1, a drain current (modulation current) of the transistor M1 is modulated depending on a voltage level of the single-ended input signal Vi. However, as described above, when a modulation current flows through the node X, a high-frequency component of this modulation current is attenuated by a parasitic capacity of the node X. On the other hand, (a high-frequency component of) the inverted output signal Von is inputted to the gate terminal of the transistor M3 included in the auxiliary circuit 2. Accordingly, a voltage level of a signal given to the gate terminal of the transistor M3 is linked to a voltage level of (a high-frequency component of) the inverted output signal Von. A drain current of the transistor M3 (current flowing from the drain terminal to the source terminal of the transistor M3) is also modulated depending on a voltage level of a high-frequency component of the inverted output signal Von. A change in drain current of the transistor M3 compensates for at least a portion of the high-frequency component of a modulation current, which is lost due to a parasitic capacity of the node X. Therefore, a differential output signal is improved in symmetry.

Meanwhile, even the differential output signal in FIG. 3 is not perfectly symmetric. Factors for this imperfect symmetry may include, for example, a drain capacity of the transistor M3 included in the auxiliary circuit 2, the other parasitic capacities of the node X, etc. It is not easy to bring perfect symmetry to a differential output signal of the single-ended input to differential output converting circuit 12. However, a differential output signal of the single-ended input to differential output converting circuit 12 can be further improved in its symmetry by adjusting the inductance of the inductors L1 and L2, as explained below.

Figure 4:
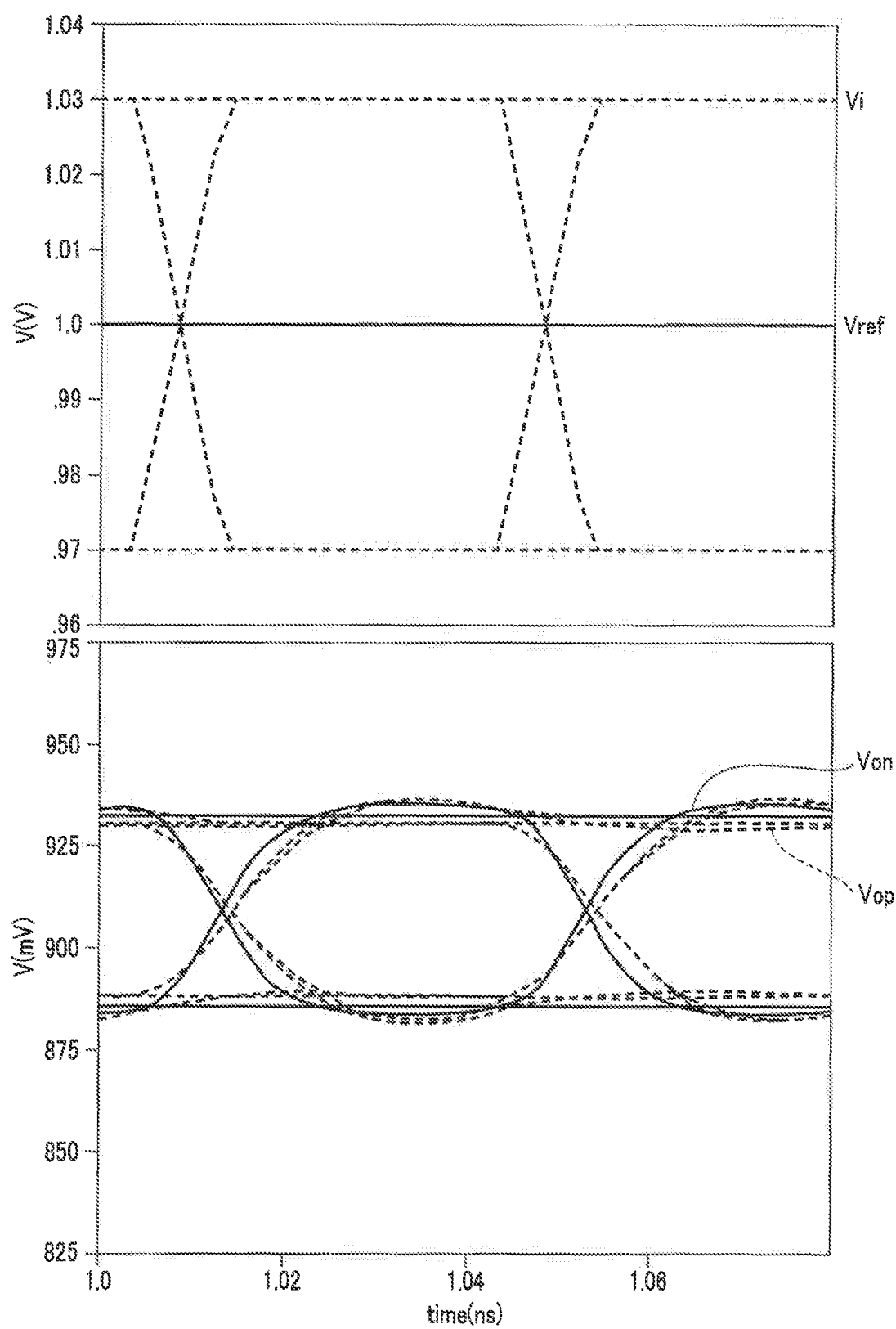
FIG. 4 is a graph illustrating eye patterns in the case where the single-ended input to differential output converting circuit in FIG. 1 is adjusted in inductance.

FIG. 4 illustrates the single-ended input signal Vi, the reference voltage signal Vref, the non-inverted output signal Vop, and the inverted output signal Von in the single-ended input to differential output converting circuit 12 in which the inductance of the inductors L1 and L2 is adjusted. FIG. 4 is a view in which the results of transient-response analysis of those signals are displayed in an eye pattern, as in FIGS. 2 and 3. The simulation shown in FIG. 4 was conducted under the same condition as that of the simulation in FIG. 3, except that the inductance of the inductors L1 and L2 was adjusted. Therefore, the eye patterns of single-ended input signal Vi and reference voltage signal Vref are the same as those in FIG. 3.

It is clear that the differential output signal in FIG. 4 is further improved in symmetry as compared to that of FIG. 3. The reason is considered to be that a high-frequency component lost from the non-inverted output signal Vop is compensated for by rendering the inductor L2 higher in inductance than the inductor L1. As described, a further improvement in symmetry of a differential output signal can be expected by increasing the load inductance for an output signal in which a high-frequency component is lost.

When the inductor L2 is rendered higher in inductance than the inductor L1, a parasite resistance connected in series to the inductor L2 is also increased. To secure a symmetry of the differential amplifier 1, it is preferable that a series combined resistance of a parasite resistance of the inductor L1 and the resistor R1 take values substantially equal to a series combined resistance of a parasite resistance of the inductor L2 and the resistor R2. Therefore, if the inductor L2 is made higher in inductance than the inductor L1, a resistance value of the resistor R2 may be made smaller than that of the resistor R1 in order to strike a balance.

In this example, the inductor L2 is made higher in inductance than the inductor L1. However, the inductor L1 may be made higher in inductance than the inductor L2 depending on the values taken by the capacitor C1, the resistor R1, and the transistor M3.

As described above, the single-ended input to differential output converting circuit according to this embodiment includes the auxiliary circuit containing the transistor in addition to the differential amplifier. This particular transistor has a control terminal and current terminals, in which the control terminal receives a high-frequency component of an inverted output signal of the single-ended input to differential output converting circuit, and one of the current terminals is connected to a common node (for example, a common source) of a pair of transistors included in the differential amplifier. This particular transistor compensates for a high-frequency component that is lost from a modulation current flowing between the pair of transistors included in the differential amplifier. Accordingly, this single-ended input to differential output converting circuit improves the differential output signal symmetry as compared to the one without the auxiliary circuit, thereby being able to is contribute to the improvement of signal transmission rate.

In the above description, input signals of the single-ended input to differential output converting circuit are the single-ended input signal Vi and the reference voltage signal Vref. However, those signals may be replaced with a differential input signal, that is, a non-inverted input signal and an inverted input signal. In such a case, the single-ended input to differential output converting circuit operates as a differential amplifier. This particular differential amplifier can generate a differential output signal superior in symmetry by amplifying a voltage level of a differential input signal inferior in symmetry. In the case where the single-ended input to differential output converting circuit according to this embodiment is operated as a differential amplifier, different element parameters may be set as compared to the case where the single-ended input to differential output converting circuit is operated as is.

In the description above, both input and output of the single-ended input to differential output converting circuit are voltage signals. However, modification may be made in a manner so that one or both input and output may be a current signal.

(Modification)

Figure 5:
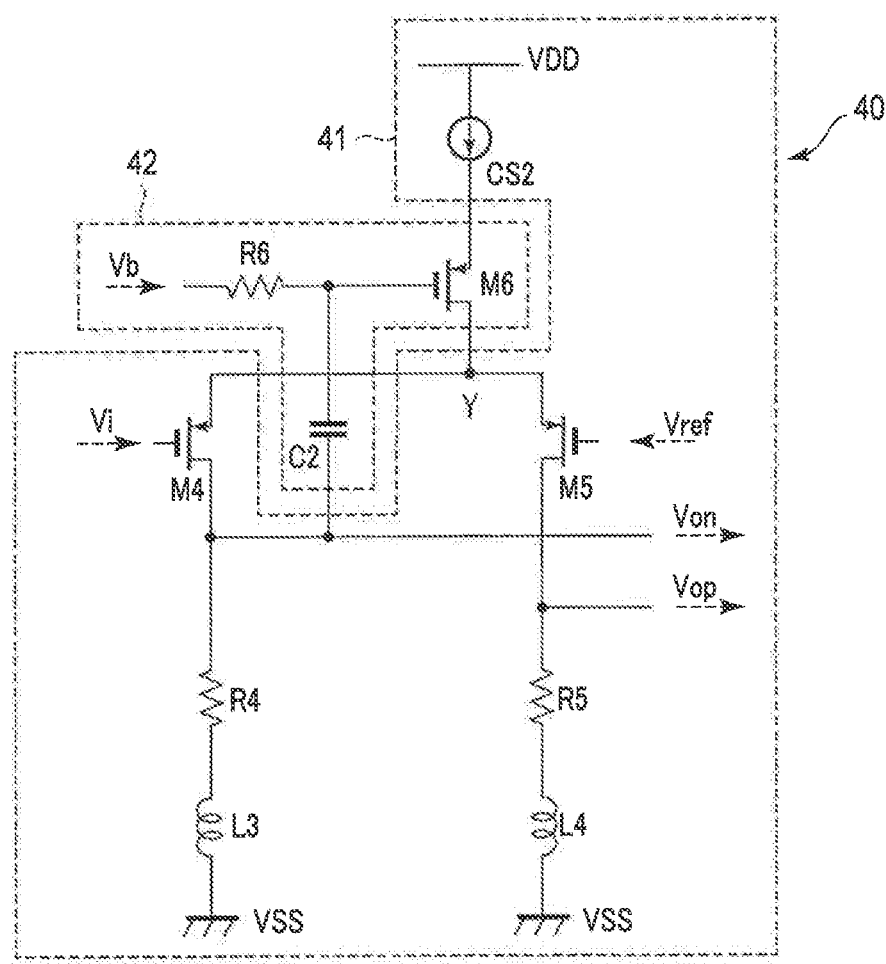
FIG. 5 is a circuit diagram illustrating a modification of the single-ended input to differential output converting circuit according to the embodiment.

The single-ended input to differential output converting circuit according to the above embodiment may also be realized by using a transistor with the reversed polarity of the transistor shown in FIG. 1. Such a modification is illustrated in FIG. 5. A single-ended input to differential output converting circuit 40 in FIG. 5 includes a differential amplifier 41 and an auxiliary circuit 42.

If a differential input signal is given, the differential amplifier 41 can generate a differential output signal by amplifying a voltage level of the given differential input signal. However, the following description will be made based on the case where the differential amplifier 41 performs single-ended to differential conversion, as is the case with the differential amplifier 1 shown in FIG. 1.

Specifically, the differential amplifier 41 includes a transistor M4, a transistor M5, a current source CS2, an inductor L3, a resistor R4, an inductor L4, and a resistor R5. The transistor M4 receives the single-ended input signal Vi and outputs the inverted output signal Von. The transistor M5 receives the reference voltage signal Vref and outputs the non-inverted output signal Vop. The current source CS2 is connected to a common node of the transistors M4 and M5. The inductor L3 and the resistor R4 take the form of loads at the inverted output signal Von side. The inductor L4 and the resistor R5 take the form of loads at the non-inverted output signal Vop side.

The transistor M4 is, for example, a P channel FET and includes a control terminal (gate terminal) and two current terminals (a drain terminal and a source terminal). The transistor M4 may adopt, but is not limited to, MOSFET in a CMOS process of 65-nm node.

In the transistor M4, the gate terminal receives the single-ended input signal Vi. The amount of current flowing through a channel between the drain terminal and the source terminal of the transistor M4 depends on a gate potential of the transistor M4. The gate terminal of the transistor M4 corresponds to a non-inverted input terminal of the differential amplifier 41.

The drain terminal of the transistor M4 outputs the inverted output signal Von. The drain terminal of the transistor M4 corresponds to an inverted output terminal of the differential amplifier 41. Furthermore, the drain terminal of the transistor M4 is connected to the power supply VSS via the inductor L3 and the resistor R4. Herein, a voltage of the power supply VSS is, for example, 0 [V] (that is, the power supply VSS corresponds to ground), but is not limited thereto.

The source terminal of the transistor M4 is connected to a power supply VDD via the current source CS2 and a transistor M6 included in the auxiliary circuit 42 (to be described later). Herein, a voltage of the power supply VDD is, for example, 1.2 [V], but is not limited thereto.

Furthermore, the source terminal of the transistor M4 is connected to the source terminal of the transistor M5. That is, the transistors M4 and M5 are paired as transistors sharing a common source. The common source of the transistors M4 and M5 is also called a node Y.

As is the case for the transistor M4, the transistor M5 is, for example, a P channel FET and includes a control terminal (gate terminal) and two current terminals (a drain terminal and a source terminal).

In the transistor M5, the gate terminal receives the reference voltage signal. The amount of current flowing through a channel between the drain terminal and the source terminal of the transistor M5 depends on a gate potential of the transistor M5. The gate terminal of the transistor M5 corresponds to an inverted input terminal of the differential amplifier 41.

The drain terminal of the transistor M5 outputs the non-inverted output signal Vop. The drain terminal of the transistor M5 corresponds to a non-inverted output terminal of the differential amplifier 41. Furthermore, the drain terminal of the transistor M5 is connected to the power supply VSS via the inductor L4 and the resistor R5.

The source terminal of the transistor M5 is connected to the power supply VDD via the current source CS2 and the transistor M6. Furthermore, the source terminal of the transistor M5 is connected to the source terminal, that is, the node Y, of the transistor M4.

The current source CS2 includes a first current terminal and a second current terminal. The first current terminal of the current source CS2 is connected to the node Y via the transistor M6. The second current terminal of the current source CS2 is connected to the power supply VDD. The current source CS2 is a constant current source that causes a constant amount of current to flow between the first current terminal and the second current terminal. For example, a current flowing through the current source CS2 is 5 [mA], but is not limited thereto.

The current source CS2 may be, for example, a transistor (e.g., a P channel FET), in which a constant voltage is applied to a control terminal (e.g. a gate terminal) of this transistor. The current source CS2 is not limited to a single transistor, and may include a plurality of transistors. In the differential amplifier 41, the current source CS2 may be replaced with a resistive element such as a resistor.

The inductor L3 includes a first terminal and a second terminal. The first terminal of the inductor L3 is connected to the power supply VSS. The second terminal of the inductor L3 is connected to the first terminal of the resistor R4. The inductor L3 may be an on-chip inductor formed by wiring Cu (copper) in a spiral shape. A value of the inductor L3 may be taken as, but is not limited to, 1.0 [nH], for example.

The inductor L4 includes a first terminal and a second terminal. The first terminal of the inductor L4 is connected to the power supply VSS. The second terminal of the inductor L4 is connected to the first terminal of the resistor R5. The inductor L4 may be an on-chip inductor formed by wiring Cu (copper) in a spiral shape. A value of the inductor L4 may be taken as, but is not limited to, 1.0 [nH], for example.

The inductor L3 and the inductor L4 may be the same or different in inductance. As in the relation between the inductors L1 and L2 shown in FIG. 1, a differential output signal can be further improved in its symmetry by adjusting the inductors L3 and L4 in a manner so that they take different values.

The resistor R4 includes a first terminal and a second terminal. The first terminal of the resistor R4 is connected to the second terminal of the inductor L3. The second terminal of the resistor R4 is connected to the drain terminal of the transistor M4. The resistor R4 may be formed of, for example, poli-Si (silicon). For example, a value of the resistor 14 may be taken as, but is not limited to, 120 [Ω].

The resistor R5 includes a first terminal and a second terminal. The first terminal of the resistor R5 is connected to the second terminal of the inductor L4. The second terminal of the resistor R5 is connected to the drain terminal of the transistor M5. The resistor R5 may be formed of, for example, poli-Si (silicon). As an example, a value of the resistor R5 may be taken as, but is not limited to, 120 [Ω].

The resistor R4 and the resistor R5 may be either the same or different in resistance value. If the inductors L3 and L4 are adjusted to take different values, the resistors R4 and R5 may also be adjusted to take different values in order to secure the symmetry of the differential amplifier 41.

Meanwhile, a parasitic resistance of the inductor L3 and/or the inductor L4 may substitute for the resistor R4 and/or the resistor R5. Alternatively, the inductor L3 and/or the inductor L4 may be removed from the differential amplifier 41. In terms of layout, it is possible to swap the inductor L3 and the resistor R4 and also to swap the inductor L4 and the resistor R5.

The auxiliary circuit 42 improves the symmetry of differential output signal, as in the auxiliary circuit 2 shown in FIG. 1. The auxiliary circuit 42 includes the transistor M6, a capacitor C2, and a resistor R6.

As is the case for the transistors M4 and M5, the transistor M6 is, for example, a P channel FET and includes a control terminal (gate terminal) and two current terminals (a drain terminal and a source terminal).

The transistor M6 has a gate terminal connected to the second terminal of the capacitor C2 and the second terminal of the resistor R6. The aforementioned capacitor C2 and resistor R6 function as a high-pass filter. In the transistor M6, therefore, the gate terminal receives a high-frequency component of the inverted output signal Von. The amount of current flowing through a channel between the drain terminal and the source terminal of the transistor M6 depends on a gate potential of the transistor M6. The inverted output signal Von may be directly applied to the gate terminal of the transistor M6 without using a high-pass filter. This case can also benefit from the advantageous effects of the embodiment. However, in the following description, a case using a high-pass filter will be explained.

The drain terminal of the transistor M6 is connected to the common source, that is, the node Y, of the transistors M4 and M5. On the other hand, the source terminal of the transistor M6 is connected to the power supply VDD via the current source CS2.

The transistor M6 and the current source CS2 can be swapped in layout. That is, the drain terminal and the source terminal of the transistor M6 may be directly or indirectly connected (electrically connected) to the node Y and the power supply VDD, respectively. However, such a layout swap increases the adverse effects of a transistor as the current source CS2. Thus, a differential output signal according to the layout shown in FIG. 5 is superior in symmetry.

The capacitor C2 includes a first terminal and a second terminal. The first terminal of the capacitor C2 is connected to the drain terminal of the transistor M4. That is, the first terminal of the capacitor C2 receives the inverted output signal Von. The second terminal of the capacitor C2 is connected to the gate terminal of the transistor M6 and the second terminal of the resistor R6. The capacitor C2 may be an MOM capacitor formed by stacking a comb-shaped electrode using an oxide film as dielectric, for example. A value of the capacitor C2 may be taken as, but is not limited to, 25 [fF].

The resistor R6 includes a first terminal and a second terminal. The first terminal of the resistor R5 receives a bias voltage signal Vb. The second terminal of the resistor R6 is connected to the gate terminal of the transistor M6 and the second terminal of the capacitor C2. The resistor R6 may be formed of, for example, poli-Si (silicon). A value of the resistor R6 may be taken as, but is not limited to, 20 [kΩ].

The capacitor C2 and the resistor R6 correspond to a high-pass filter. This high-pass filter extracts a high-frequency component from the inverted output signal Von, thereby supplying this extracted component to the gate terminal of the transistor M6. This enables the amplitude of the high-frequency component of the inverted output signal Von, which is applied to the gate terminal of the transistor M6, to be adjusted depending on a value of the capacitor C2. Furthermore, a suitable bias voltage signal Vb can be applied to the gate terminal of the transistor M6 via the resistor R6, as described later. In this way, by using the high-pass filter, a signal applied to the date terminal of the transistor M6 can be easily controlled. This produces an advantageous effect of improved degree of freedom in circuit design. The capacitor C2 and the resistor R6 are a mere example of the high-pass filter. For example, the resistor R6 may be replaced with an inductor (not shown). Not only a high-pass filter but also various types of circuits or their combinations may be used in order to extract a high-frequency component from the inverted output signal Von.

It is preferable that a voltage level of the bias voltage signal Vb be constant (except for fluctuations due to noise or drift). In addition, it is preferable that a voltage level of the bias voltage signal Vb fall within a range described below, as in the example shown in FIG. 1.

Specifically, in cases where a voltage level of the bias voltage signal Vb is too low, the transistor M6 experiences a shortage of drain-source voltage and thus ends up operating within a linear region. This makes it difficult to control a current flowing through the channel between the drain and the source of the transistor M6. Therefore, a lower limit for a voltage level of the bias voltage signal Vb is set to a value in a manner to ensure a drain-source voltage necessary for the transistor M6 to operate within a saturated region can be secured. In contrast, in cases where a voltage level of the bias voltage signal Vb is too high, a source potential of the transistor M6 increases excessively and, for example, causes a shortage of drain-source voltage of the transistor as the current source CS2. As a result, the current source CS2 is no longer operable as a constant current source. Therefore, an upper limit for a voltage level of the bias voltage signal Vb is set to a value in a manner so that the current source CS2 is operable as a constant current source. As described above, it is preferable that a voltage level of the bias voltage signal Vb fall into a range in which the transistor M6 is operable within a saturated region and the current source CS2 is operable as a constant current source.

In this modification also, the transistor M6 included in the auxiliary circuit 42 compensates for a modulation current that is lost from a modulation current flowing between the transistors M4 and M5 included in the differential amplifier 41. Accordingly, the single-ended input to differential output converting circuit shown in FIG. 5 can produce a similar effect to that of the single-ended input to differential output converting circuit shown in FIG. 1.

Example 1

Figure 6:
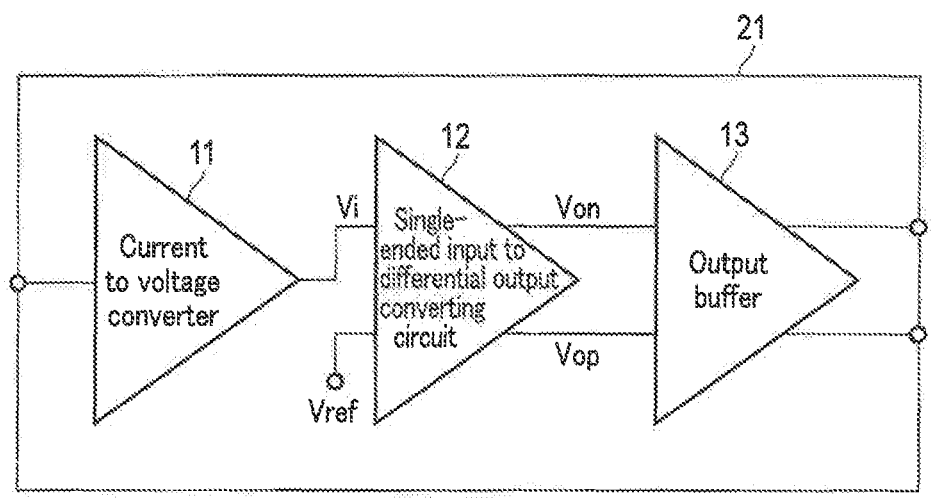
FIG. 6 is a view of a receiving circuit including the single-ended input to differential output converting circuit according to the embodiment.

The single-ended input to differential output converting circuit according to the embodiment is incorporable into, for example, a receiving circuit 21 shown in FIG. 6. In a system such as an optical transmission system or a wireless communications system, in which single-ended signals are transmitted, the receiving circuit 21 can be used to convert a received single-ended signal into a differential signal.

The receiving circuit 21 includes a current to voltage converter 11, the single-ended input to differential output converting circuit 12, and an output buffer 13. The receiving circuit. 21 receives a single-ended current signal from a stage before the receiving circuit 21 and supplies a differential voltage signal to a stage after the receiving circuit 21.

The current to voltage converter 11 is sometimes called a "TIA" (Transimpedance Amplifier), and performs current-to-voltage conversion for a single-ended current signal, thereby generating a single-ended voltage signal. The current to voltage converter 11 transmits a single-ended voltage signal to the single-ended input to differential output converting circuit 12.

The single-ended input to differential output converting circuit 12 may be, for example, the single-ended input to differential output converting circuit 12 shown in FIG. 1, the single-ended input to differential output converting circuit 40 shown in FIG. 5, or the single-ended input to differential output converting circuit 12 or 40 with the differential amplifier connected thereto in single or multiple stages.

The single-ended input to differential output converting circuit 12 receives, just as the aforementioned single-ended input signal Vi, a single-ended voltage signal from the current to voltage converter 11, and performs a single-ended to differential conversion for this received signal, thereby generating a differential voltage signal (that is, the non-inverted output signal Vop and the inverted output signal Von) superior in symmetry. The single-ended input to differential output converting circuit 12 transmits a differential voltage signal to the output buffer 13.

The output buffer 13 sends out a differential voltage signal in a manner to drive a transmission line (for example, characteristic impedance of 50 [Ω] as a single-ended (100 [Ω] as a differential) on a printed substrate, and a terminal resistance (for example, 50 [Ω] as a single-ended (100 [Ω] as a differential)) of a connection destination. Specifically, the output buffer 13 may have the differential amplifier connected thereto in single or multiple stages. Furthermore, the output buffer 13 may include a pre-emphasis circuit for loss compensation.

Example 2

Figure 7:
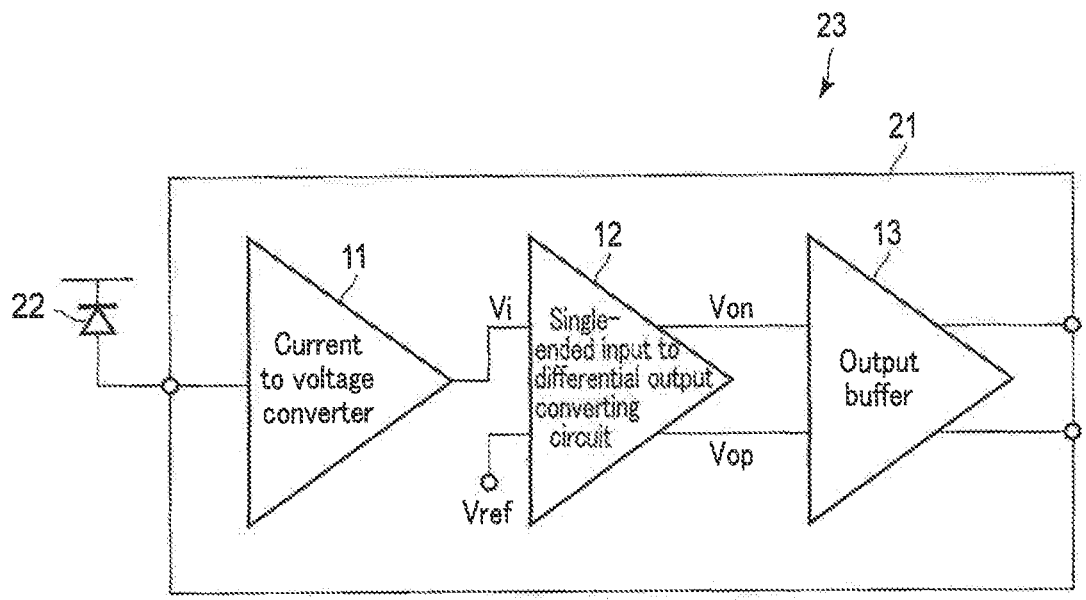
FIG. 7 is a view of an optical receiver including the receiving circuit in FIG. 6.

The receiving circuit according to example 1 is incorporable into, for example, an optical receiver 23 shown in FIG. 7. In an optical transmission system, the optical receiver 23 can be used to convert a received single-ended optical signal into a differential voltage signal. The optical receiver 23 includes a light-receiving element 22 and the receiving circuit 21.

The light-receiving element 22 receives a single-ended optical signal and performs photoelectric conversion thereto, thereby generating a single-ended electrical signal (single-ended current signal). The light-receiving element 22 may be, for example, a PIN Photo Diode (PD). The light-receiving element 22 transmits a single-ended current signal to the receiving circuit 21.

Example 3

Figure 8:
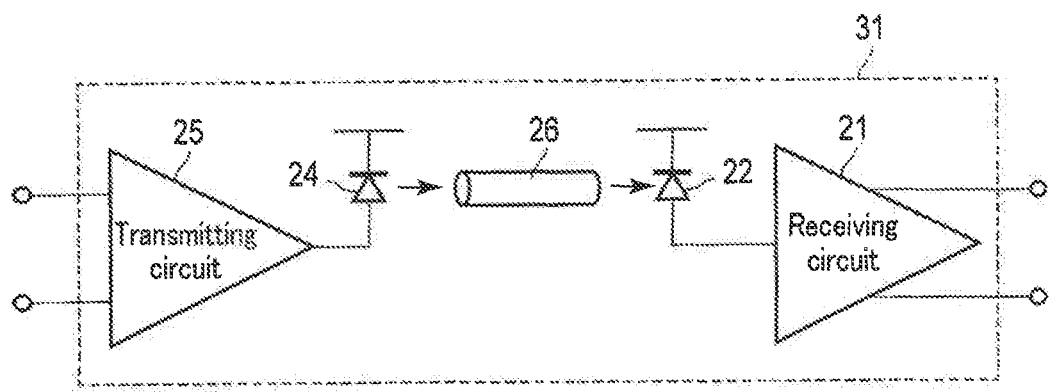
FIG. 8 is a view of an optical transmission system including the optical receiver in FIG. 7.

The optical receiver according to example 2 is incorporable into, for example, an optical transmission system 31 shown in FIG. 8. The optical transmission system 31 includes an optical transmitter, an optical transmission line 26, and an optical receiver. The optical transmitter inputs a differential voltage signal and sends out this signal as a single-ended optical signal to the optical transmission line 26. The optical receiver receives the single-ended optical signal from the optical transmission line 25, and regenerates this received signal as a differential voltage signal.

The optical transmitter includes a transmitting circuit 25 and a light-emitting element 24. The transmitting circuit 25 inputs a differential voltage signal and performs at least differential to single-ended conversion for this signal, thereby generating a single-ended current signal. The transmitting circuit 25 transmits a single-ended current signal to the light-emitting element 24.

The light-emitting element 24 receives a single-ended current signal from the transmitting circuit 25 and emits light in accordance with this received signal, thereby generating a single-ended optical signal in accordance with the single-ended current signal. The light-emitting element 24 may be, for example, a Vertical Cavity Surface Emitting Laser (VCSEL). The single-ended optical signal generated by the light-emitting element 24 is guided to the optical transmission line 26.

The optical transmission line 26 includes one end connected to the optical transmitter, and the other end connected to the optical receiver. The optical transmission line 26 transmits the single-ended optical signal from the optical transmitter to the optical receiver. The optical transmission line 25 is, for example, a multi-mode optical fiber made of quartz. The entire length of the optical transmission line 25 may be, for example, about 10 [m] or smaller or larger.

Example 4

Figure 9:
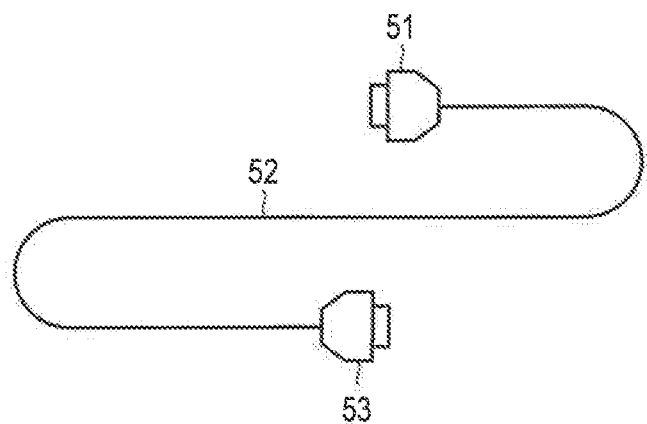
FIG. 9 is a diagram illustrating an example of application of the optical transmission system in FIG. 8.

The optical transmission system according to example 3 is usable as an Active Optical Cable (AOC) shown in FIG. 9. The active optical cable includes a connector module 51, a connector module 53, and an optical fiber cable 52 that connects the connector modules 51 and 53. For example, the active optical cable is usable for connection between devices such as a server.

Each of the connector module 51 and the connector module 53 includes one or both of the optical transmitter and the optical receiver shown in. FIG. 8. To enable two-way communication through the active optical cable shown in FIG. 9, each of the connector module 51 and the connector module 53 includes both the optical transmitter and the optical receiver. On the other hand, to enable one-way communication and disable two-way communication through the active optical cable shown in FIG. 9, the connector module 51 includes the optical transmitter (or the optical receiver), and the connector module 53 includes the optical receiver (or the optical transmitter).

The optical fiber cable 52 corresponds to the optical transmission line 26 shown in FIG. 8. The optical fiber cable 52 may include a plurality of channels. To enable two-way communication through the active optical cable shown in FIG. 9, in the optical fiber cable 52, the number of channels for transmitting an optical signal in a direction from the connector module 51 to the connector module 53 may be either equal to, or different from, the number of channels for transmitting an optical signal in the reverse direction.

Example 5

Figure 10:
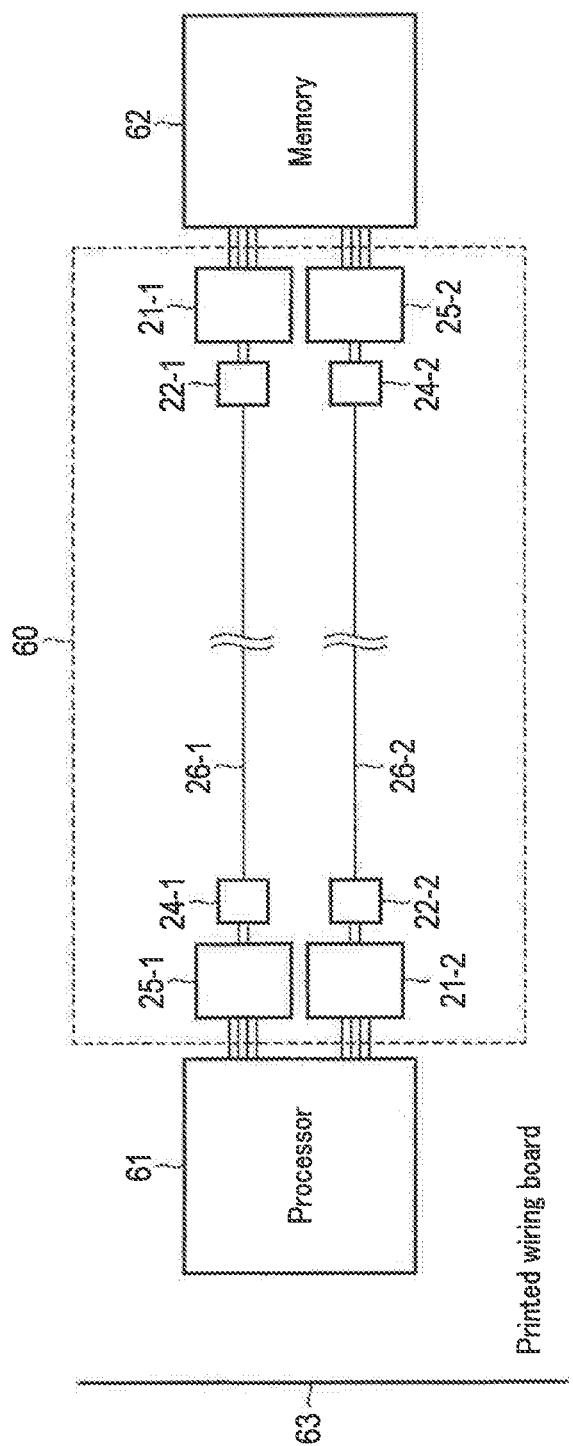
FIG. 10 is a diagram illustrating another example of application of the optical transmission system in FIG. 8.

The optical transmission system according to example 3 is usable as an optical transmission system 60 for high-rate transmission of electrical signals between a processor 61 and a memory 62, as shown in FIG. 10.

A transmitting circuit 25-1 receives a differential voltage signal from the processor 61 via electrical wiring formed on a printed wiring board 53, and converts this received signal into a single-ended current signal. The transmitting circuit 25-1 transmits the single-ended current signal to a light-emitting element 24-1 via electrical wiring formed on the printed wiring board 63.

The light-emitting element 24-1 generates a single-ended optical signal in accordance with the single-ended current signal. The light-emitting element 24-1 and a light-receiving element 22-1 are optically coupled by an optical transmission line 26-1 formed on the printed wiring board 63. The light-receiving element 22-1 receives the single-ended optical signal generated by the light-emitting element 24-1, and converts this received signal into a single-ended current signal.

The receiving circuit 21-1 receives the single-ended optical signal from the light-receiving element 22-1 via electrical wiring formed on the printed wiring hoard 63, and converts this received signal into a differential voltage signal. The receiving circuit 21-1 transmits the differential voltage signal to memory 62 via electrical wiring formed on the printed wiring board 63.

A transmitting circuit 25-2 receives a differential voltage signal from the memory 62 via electrical wiring formed on the printed wiring board 63, and converts this received signal into a single-ended current signal. The transmitting circuit 25-2 transmits the single-ended current signal to a light-emitting element 24-2 via electrical wiring formed on the printed wiring board 63.

The light-emitting element 24-2 generates a single-ended optical signal in accordance with the single-ended current signal. The light-emitting element 24-2 and the light-receiving element 22-2 are optically coupled by an optical transmission line 26-2 formed on the printed wiring board 63. The light-receiving element 22-2 receives the single-ended optical signal generated by the light-emitting element 24-2, and converts this received signal into a single-ended current signal.

The receiving circuit 21-2 receives the single-ended current signal from the light-receiving element 22-2 via electrical wiring formed on the printed wiring hoard 63, and converts this received signal into a differential voltage signal. The receiving circuit 21-2 transmits the differential voltage signal to a processor 61 via electrical wiring formed on the printed wiring board 63.

FIG. 10 illustrates an example in which the optical transmission system according to example 3 is used for two-way communication between the processor 61 and the memory 62. However, the optical transmission system according to example 3 may not be used for one-way communication in one direction or one-way communication in the other direction between the processor 61 and the memory 62.

The blocks, the circuits inside the blocks, the elements inside the circuits, etc., explained in the above embodiments serve as mere examples, and are replaceable with other blocks, circuits, elements, etc., possessing similar functions.

For example, instead of the MOS transistor as one type of FET, another type of FET, a bipolar transistor, a Bi-CMOS transistor, and a transistor of the other types are also usable as the transistor. Instead of the vertical cavity surface emitting laser, a light-emitting diode, a semiconductor laser, or a light-emitting element of the other types are usable as the light-emitting element. Furthermore, instead of the PIN photo diode, an MSM (Metal-Semiconductor-Metal) photo diode, an avalanche photodiode, a photoconductor, or other types of light-receiving element are usable as the light-receiving element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A circuit comprising:
a first transistor that includes a first control terminal to receive a first input signal, a first current terminal to output an inverted output signal, and a second current terminal;
a second transistor that includes a second control terminal to receive a second input signal, a third current terminal to output a non-inverted output signal, and a fourth current terminal connected to the second current terminal; and
a third transistor that includes a third control terminal to receive the inverted output signal, a fifth current terminal electrically connected to the second current terminal and the fourth current terminal, and a sixth current terminal electrically connected to a first power supply; and
a high-pass filter that is connected between the first current terminal and the third control terminal.

2. The circuit according to claim 1, wherein the high-pass filter comprises:
a capacitor that is connected between the first current terminal and the third control terminal; and
a resistor that includes a first terminal to receive a bias signal, and a second terminal connected to the third control terminal.

3. A circuit comprising:
a first transistor that includes a first control terminal to receive a first input signal, a first current terminal to output an inverted output signal, and a second current terminal;
a second transistor that includes a second control terminal to receive a second input signal, a third current terminal to output a non-inverted output signal, and a fourth current terminal connected to the second current terminal; and
a third transistor that includes a third control terminal to receive the inverted output signal, a fifth current terminal electrically connected to the second current terminal and the fourth current terminal, and a sixth current terminal electrically connected to a first power supply;
a first inductor that is connected between the first current terminal and a second power supply; and
a second inductor that is connected between the third current terminal and the second power supply, wherein the first inductor and the second inductor are different in inductance.

4. A circuit comprising:
a first transistor that includes a first control terminal to receive a first input signal, a first current terminal to output an inverted output signal, and a second current terminal;
a second transistor that includes a second control terminal to receive a second input signal, a third current terminal to output a non-inverted output signal, and a fourth current terminal connected to the second current terminal; and
a third transistor that includes a third control terminal to receive the inverted output signal, a fifth current terminal electrically connected to the second current terminal and the fourth current terminal, and a sixth current terminal electrically connected to a first power supply; and
a current source that is connected between the sixth current terminal and the first power supply.

5. The circuit according to claim 4, wherein:
the first input signal is a single-ended input signal; and
the second input signal is a reference signal.

6. A receiving circuit comprising:
a current to voltage converter that converts a single-ended current signal into a single-ended voltage signal;
the circuit according to claim 5, which receives the single-ended voltage signal as the single-ended input signal; and
an output buffer that sends out the non-inverted output signal and the inverted output signal, as a differential signal.

7. An optical receiver comprising:
the receiving circuit according to claim 6; and
a light-receiving element that converts an optical signal into the single-ended current signal.

8. An optical transmission system comprising:
the optical receiver according to claim 7; and
an optical transmitter that transmits the optical signal.

9. An active optical cable comprising the optical transmission system according to claim 8.

10. The system according to claim 8, wherein the optical transmitter converts into the optical signal, one of an electrical signal outputted from a processor to a memory and an electrical signal outputted from the memory to the processor.

* * * * *